US006906978B2

(12) United States Patent
Elzur et al.

(10) Patent No.: US 6,906,978 B2
(45) Date of Patent: Jun. 14, 2005

(54) FLEXIBLE INTEGRATED MEMORY

(75) Inventors: Uri Elzur, Zichron (IL); Yuval Bachrach, Haifa (IL)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/100,212

(22) Filed: Mar. 19, 2002

(65) Prior Publication Data

US 2003/0179637 A1 Sep. 25, 2003

(51) Int. Cl.[7] .............................. G11C 8/00; G11C 7/00; G06F 12/00

(52) U.S. Cl. ............. 365/230.03; 365/233; 365/189.04; 365/189.05; 365/230.06; 365/230.08; 711/5; 711/105; 711/173

(58) Field of Search ............................ 365/230.03, 233, 365/189.04, 230.08; 711/5, 105, 107

(56) References Cited

U.S. PATENT DOCUMENTS

| | | | | | |
|---|---|---|---|---|---|
| 4,323,968 | A | * | 4/1982 | Capozzi | 714/52 |
| 5,706,466 | A | | 1/1998 | Dockser | |
| 5,752,071 | A | | 5/1998 | Tubbs et al. | |
| 5,809,328 | A | * | 9/1998 | Nogales et al. | 710/5 |
| 5,826,105 | A | | 10/1998 | Burstein et al. | |
| 5,867,723 | A | * | 2/1999 | Chin et al. | 712/11 |
| 5,880,971 | A | * | 3/1999 | Dangelo et al. | 716/6 |
| 5,903,910 | A | * | 5/1999 | Tran et al. | 711/132 |
| 5,958,038 | A | | 9/1999 | Agrawal et al. | |
| 6,145,072 | A | * | 11/2000 | Shams et al. | 712/22 |
| 6,266,751 | B1 | * | 7/2001 | Niescier | 711/173 |
| 6,279,098 | B1 | * | 8/2001 | Bauman et al. | 712/13 |
| 6,430,654 | B1 | * | 8/2002 | Mehrotra et al. | 711/118 |
| 6,510,510 | B1 | * | 1/2003 | Garde | 712/218 |
| 6,538,911 | B1 | * | 3/2003 | Allan et al. | 365/49 |
| 6,539,457 | B1 | * | 3/2003 | Mulla et al. | 711/131 |
| 6,629,284 | B1 | * | 9/2003 | Leermakers | 714/748 |
| 6,732,247 | B2 | * | 5/2004 | Berg et al. | 711/169 |
| 2001/0042178 | A1 | * | 11/2001 | Achilles et al. | 711/150 |
| 2002/0056022 | A1 | * | 5/2002 | Leung | 711/106 |
| 2002/0108054 | A1 | * | 8/2002 | Moore et al. | 713/200 |
| 2002/0188812 | A1 | * | 12/2002 | Sadhasivan et al. | 711/153 |
| 2002/0188885 | A1 | * | 12/2002 | Sihborn et al. | 713/600 |
| 2003/0005229 | A1 | * | 1/2003 | Rangan | 711/122 |
| 2003/0028845 | A1 | * | 2/2003 | Plante et al. | 714/796 |
| 2003/0032486 | A1 | * | 2/2003 | Elliott | 463/43 |
| 2003/0126354 | A1 | * | 7/2003 | Kahn et al. | 711/105 |
| 2003/0126386 | A1 | * | 7/2003 | Lakhani et al. | 711/159 |
| 2003/0177319 | A1 | * | 9/2003 | de Jong | 711/154 |
| 2004/0139276 | A1 | * | 7/2004 | Srinivasan et al. | 711/108 |

* cited by examiner

*Primary Examiner*—David Nelms
*Assistant Examiner*—Ly Duy Pham
(74) *Attorney, Agent, or Firm*—Eitan, Pearl, Latzer & Cohen Zedek LLP

(57) ABSTRACT

A system and method for allowing simultaneous access to different sections of a memory utilizes a memory including a number of memory banks which may be divided among several partitions. Control circuitry allows simultaneous access to memory banks from each partition.

9 Claims, 2 Drawing Sheets

FLEXIBLE INTEGRATED MEMORY

FIELD OF THE INVENTION

The present invention relates to a memory; more specifically to a random access memory (RAM) which may be partitioned into sections for, for example, code and data, where each partition may be accessed simultaneously.

BACKGROUND OF THE INVENTION

Certain devices, such as a "computer on a chip", are computing devices including, for example, a processor, a RAM for storing data, and a memory for storing code; the code which is loaded changes depending on the application. Since in some such devices the application executed by the device may vary, the size requirements for data and code segments may also vary.

Memories exist which provide for simultaneous access to memory data via two ports. However, such memories typically require that each memory cell include extra circuitry, beyond what is required in conventional memory cells. Such dual port memories may be expensive to construct, and may be larger in size than conventional memories. Furthermore, since such memories are not partitionable, such memories cannot respond to the varying code and data size requirements of devices that may be used with different applications.

Thus, a need exists for an inexpensive and size efficient memory providing simultaneous access to several partitions, where the size of the partitions may be varied.

BRIEF DESCRIPTION OF THE DRAWINGS

The present invention will be understood and appreciated more fully from the following detailed description taken in conjunction with the drawings in which.

DETAILED DESCRIPTION OF THE INVENTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Figure 1:
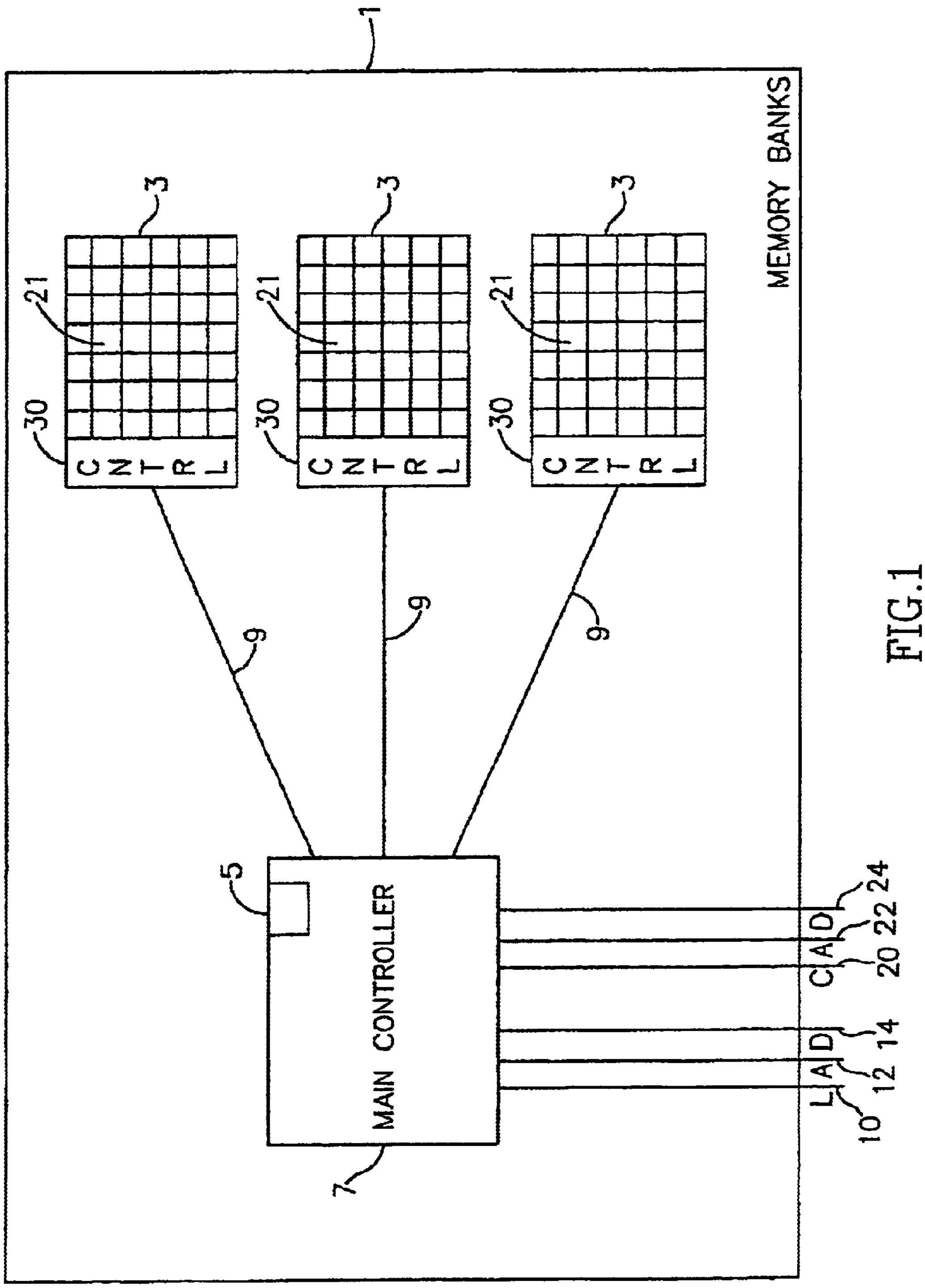
FIG. 1 is a schematic diagram of a memory device according to an embodiment of the present invention.

FIG. 1 is a schematic diagram of a memory device according to an embodiment of the present invention. Referring to FIG. 1, memory 1 includes a first set of control lines 10, a first set of address lines 12, a first set of data lines 14, a second set of control lines 20, a second set of address lines 22, a second set of data lines 24, and a plurality of memory banks 3, each storing a set of data. In an exemplary embodiment, three memory banks 3, each including 32K bytes, are included; in alternate embodiments, other numbers of memory banks may be used, and each memory bank may store different amounts of data. Each memory bank 3 preferably includes or is associated with a controller 30, for accessing the associated memory bank 3. In one embodiment, each controller 30 is a memory controller of preferably known construction, accessing its associated memory bank 3 in a known manner, and possibly including additional functionality and circuitry according to an embodiment of the present invention. Each controller 30 preferably includes circuitry allowing memory bank 3 to be accessed via control lines 9. In alternate embodiments, each memory bank may include sub-banks and sub-controllers, according to known methods. In alternate embodiments, the memory banks 3 may be separate memories, or may be partitions, such as virtual partitions, of the same memory.

Memory 1 preferably includes a main controller 7, for determining which of the memory banks 3 is to be accessed and for routing access requests and data between the memory banks 3 and the control lines 10 and 20, address lines 12 and 22, and data lines 14 and 24. Main controller 7 communicates with controllers 30 via internal control lines 9. Each set of internal control lines 9 includes control, data, and address lines.

Preferably, the memory banks 3 are selectively partitionable into different sets or partitions of memory banks. Memory 1 includes a configuration register 5, for storing information on the status of the set of memory banks 3 (e.g., data or code) and determining how the memory banks 3 are to be configured. In one embodiments, such configuration determines the size of the memory block allocated to each port of the memory 1. In one embodiment, configuration register 5 stores three bits, determining how the memory banks 3 are to be divided among code and data banks. Configuration register 5 is preferably disposed within the main controller 7, but may be disposed at other locations within or without the memory 1. The configuration register 5 may be implemented in various known manners; for example as a single storage location or as multiple distributed storage locations. Other numbers of bits, and other methods, may be used to store configuration or partition information or to configure the memory 1. Furthermore, in alternate embodiments, configuration categories other than code and data may be used.

Each memory bank 3 includes a plurality of memory units 21, each preferably storing one unit of data. Units of data may be, for example, bits, bytes, words, or dwords/long words, with or without byte enables, or may be accesses as bits with masks as part of the control; other units of data may be used. Preferably each memory unit 21 is a memory unit of known construction. Each memory unit 21 is preferably a bi-stable SRAM memory cell of known CMOS construction, storing one bit of data and including components such as transistors and inverters. Preferably, each memory cell is a conventional memory cell with one set of inputs and outputs, rather than a memory cell with multiple sets of inputs and outputs as used in certain dual port memories. In alternate embodiments, other types of memory units having other construction may be used, such as DRAM or other memory units; such memory units are well known in the art. Each memory bank 3 may include include additional circuitry of known construction.

In an exemplary embodiment, each memory bank 3 is configured to hold either data or code, and the memory banks 3 are thus divided into a set of data memory banks and code memory banks. While, in one embodiment, each memory bank 3 is categorized as "data" or "code", other categorizations and numbers of categorizations are encompassed by the present invention, and more than two sets may be used. Preferably, the configuration of each memory bank 3 as one or another category is flexible, and may be changed. Thus, the memory 1 may provide varying amounts of code memory and data memory, depending on the configuration.

In an exemplary embodiment, on each clock cycle, at least one of the memory banks 3 from the set of data memory banks and at least one of the memory banks 3 from the set of code memory banks may engage in a memory operation. In an exemplary embodiment, a memory operation includes at least operations providing access to memory, such as a read operation and a write operation, but may include other operations. Thus, on the same clock cycle, data may be written to or read from a memory bank from one partition, and data may be read from or written to a memory bank from another partition.

When used herein, a main controller 7 or controllers 30 may be a unit of circuitry separate from other units, may be a set of circuitry integrated within one circuitry unit and possibly performing multiple functions (e.g., a section of circuitry providing control for multiple memory banks 3) or may be a device performing control functionality through any method, such as by implementing software or micro-code. In alternate embodiments of the present invention, the functionality and circuitry of the controllers 7 and 20 may be achieved through different methods, and may be placed in different locations. For example, while in an exemplary embodiment, a main controller 7 accepts external signals, determines which of the memory banks 3 are to be accessed, and passes signals to the controllers 30 associated with the relevant memory banks 3; in alternate embodiments, other systems and methods may be used.

To enable high frequency operation, the functionality of the main controller 7 and the controllers 30 associated with each memory bank 3 may be combined into one unit. Alternately such components may be distributed across a plurality of controllers, with no need for a main controller. For example, the controller 30 for each memory bank 3 may accept external signals and determine if it is to be active. Each set or partition may include a controller which determines which memory banks 3 are to be active during a clock cycle for operations relevant to that set or partition.

An embodiment of the system and method of the present invention will be described where the memory banks 3 are divided into code and data segments. Preferably, the data is read/write, and the code is read only, and behaves as a ROM. The code may be loaded into a section categorized as data (which is read/write) and then configured for code. However, it should be noted that the system and method of the present invention includes embodiments where other divisions of segments are possible, involving other labels than code and data, and involving other numbers of segments or sets, other dimensions, and other sets of signals.

In one embodiment, the memory 1 is divided into three memory banks 3, each associated with a controller 30. Each memory bank 3 stores 32KB, preferably in a known fashion, and may include components such as sub-memory banks or sub-controllers. The first set of control lines 10, first set of address lines 12, and first set of data lines 14 correspond to a data section and the second set of control lines 20, second set of address lines 22, and second set of data lines 24 correspond to a code section. The first (data) set of control lines 10, data lines 14 and address lines 12 carries signals such as data__ram__ck__enable, indicating when the data memory is to be active, data__we, indicating a write, data__addr, indicating the address for the data, and data__data__in and data__data__out, accepting input data and providing output data.

In one embodiment, such signals may be interpreted by the memory 1 as follows (other sets of signals and operations may be used):

| data__ram__ck__enable | data__WE | operation |
|---|---|---|
| 0 | 0 | NOP |
| 1 | 0 | READ: the value indicated at data__name__addr is sent to data__data__out. |
| 1 | 1 | WRITE: The value of data__data__in is written into memory as pointed by data__addr |
| 0 | 1 | Ilegal/Ignore |

The second (code) set of control lines 20, address lines 22 and data lines 24 carries signals such as inst__ram__ck__enable, indicating when the code memory is to be active, inst__data__out, and inst__addr. In one embodiment, such signals may be interpreted by the memory 1 as follows (other sets of signals and operations may be used):

| inst__ram__ck__enable | operation |
|---|---|
| 0 | NOP |
| 1 | READ: the value indicated at inst__addr is sent to inst__data__out. |

The configuration register 5 determines which of the memory banks 3 is to store code and which is to store data. For example, according to one scheme, if the configuration register 5 stores binary 000, all three memory banks 3 are data (preferably this is the default and is set on reset); if the configuration register 5 stores binary 010, two memory banks 3 store data and one stores code; and if the configuration register 5 stores binary 110, one memory bank 3 stores data and one stores code.

In one embodiment, on initialization all memory banks 3 are considered data, and are thus write enabled. Any code to be stored is loaded into the appropriate memory banks 3. Preferably, this is performed by an associated processor. The memory is then configured and divided into code and data by loading the proper set of bits into the configuration register 5. At this point, a processor (not shown) may run code stored in the appropriate memory banks, which are write only.

On each clock cycle, control and data signals as are known in the art are input to and received at the first and second sets of control and data lines 10, 12, 14, 20, 22 and 24. The control and data signals are passed to the main controller 7 which determines, from the configuration register 5 and the address lines 12 and 22, which of the memory banks 3 are to perform an operation. Preferably, depending on the configuration, each of the memory banks 3 is mapped to a set of addresses in either the code or data portions, such that each of the code and data portions includes a contiguous series of memory addresses. In certain embodiments, the main controller 7 or each controller 30 may include appropriate circuitry to perform such operations.

If, during a clock cycle, a code read is to be performed, the main controller 7 determines, from the configuration register 5 and the address lines 22, which of the memory banks 3 is to provide code data, and passes the appropriate control and address information to the appropriate controller 30 via internal control lines 9. The controller 30 accesses its associated memory bank 3 and provides the code data to the internal control lines 9 and the main controller 7, which outputs the data on data lines 24. A specific memory bank, when labeled as code, is preferably not necessarily mapped to the same address when labeled as data.

When the appropriate control and address signals are presented at the second set of control lines 20 and address lines 22, based on the configuration register 5 and the code__addr signals, the main controller 7 determines which memory bank 3 is to be sent a code request. The configuration register 5, in combination with the code__addr signal, is used to determine the relevant memory bank 3, preferably using a simple set of logic operations. Other appropriate data and control signals are passed to the appropriate memory bank 3 via internal control lines 9. Preferably, a memory bank 3 designated as code cannot be written to once the memory bank 3 is designated as code.

If, during a clock cycle, a data read or write is to be performed, the main controller 7 determines, from the configuration register 5 and the address lines 12, which of the memory banks 3 is to accept or provide code data, and passes the appropriate data, control and address information to the appropriate controller 30 via internal control lines 9. The appropriate controller 30 accesses its associated memory bank 3 and either provides the data to the internal control lines 9, or takes the data from the internal control lines 9 and writes the data to its associated memory bank 3. Data written to the internal control lines 9 is accepted by the main controller 7, which outputs the data on data lines 14.

When data and the appropriate control and address signals are presented at the first set of control lines 10, address lines 12, and data lines 24, based on the configuration register 5 and the data__addr signal, the main controller 7 determines which memory bank 3 is to be sent a data write or read request. In an exemplary embodiment, the upper two bits of the address, in combination with the configuration register 5, determine which of the memory banks 3 is to undergo a code or data access operation, and the remaining set of address bits are sent to the relevant memory bank 3 as the address. The configuration register 5 is used to determine the relevant memory bank 3, as with different divisions of memory banks 3, different memory banks 3 may be used for data and code. A simple set of logic operations may combine certain bits of the configuration register 5 and certain bits of the data__addr to S determine the proper memory bank. Other appropriate data and control signals are passed to the appropriate memory bank 3 via internal control lines 9.

The following table maps the addresses in a memory space of an external device (e.g., a processor) which may be presented to the memory 1, to the addresses presented to the memory banks, according to one embodiment. Such an embodiment includes three 32K memory blocks A, B and C. For each entry, addr. is the address presented to the memory block, and the entire address in the entry is the address presented to the memory 1.

| Config. Reg. | Block A mapping | Block B mapping | Block C mapping |
|---|---|---|---|
| 000 | Data: addr. + data__offset + 0 | Data: addr. + data__offset + 32K | Data: addr. + data__offset + 64K |
| 001 | Data: addr. + data__offset + 0 | Data: addr. + data__offset + 32K | Instruction: addr. + Instruction__offset + 0 |

-continued

| Config. Reg. | Block A mapping | Block B mapping | Block C mapping |
|---|---|---|---|
| 011 | Data: addr. + data__offset + 0 | Instruction: addr. + Instruction__offset + 0 | Instruction: addr. + Instruction__offset + 32K |
| 111 | Instruction: addr. + Instruction__offset + 0 | Instruction: addr. + Instruction__offset + 32K | Instruction: addr. + Instruction__offset + 64K |

An offset may be added to the address presented to the memory. For example, if the configuration register 5 is set to "011", and an external device, such as a processor, requests an instruction from the address in the instruction space address__input ="address+instruction__offset+32K," Block C is presented with "address" as the final address; the instruction__offset and 32K are subtracted from the input address. The offsets (data__offset or instruction__offset) may be selected as, for example, the most significant bits of the address so that no addition need to be used. In alternate embodiments other offsets may be used, or offsets need not be required. Selecting offsets as certain bits, e.g., the most significant bits, may save processing time and allow higher frequency operation.

In alternate embodiments, other addressing schemes may be used, and other methods of determining which memory bank 3 is to be accessed may be used. For example, a configuration register need not be used.

The appropriate controllers 30 receive signals via internal control lines 9, and, if appropriate, place data on the internal control lines 9. Preferably, one memory bank 3 from each set of memory banks 3 may perform an operation per each clock cycle. If a controller 30 determines it is to accept write data, the controller 30 accepts the write data from the internal control lines 9 and writes the data to its associated memory bank 3, preferably according to known methods. If a controller 30 determines it is to produce read data, the controller 30 places the read data on the internal control lines 9.

Figure 2:
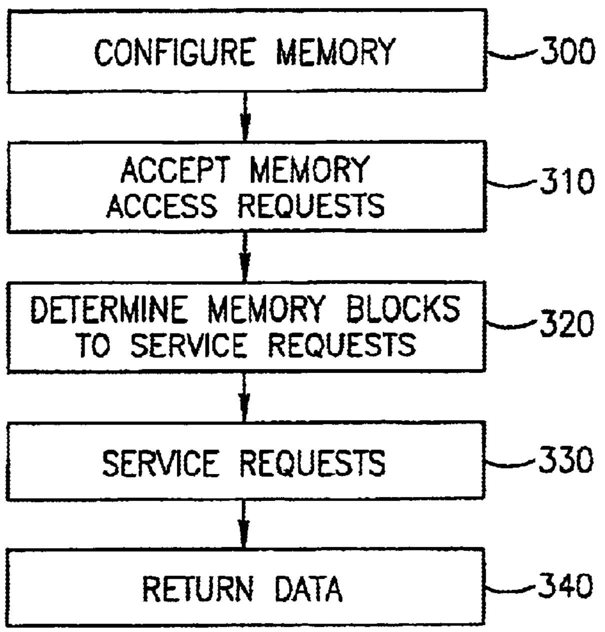
FIG. 2 is a flowchart describing a sequence of steps for the operation of a memory according to an embodiment of the present invention.

FIG. 2 is a flowchart describing a sequence of steps for the operation of a memory according to an embodiment of the present invention. Referring to FIG. 2, in step 300 the memory 1 is configured, determining the division of the memory blocks. Preferably, configuration information is entered into configuration register 5. In one embodiment, prior to configuration, the memory may be configured to be all data, so that code may be written to sections later configured to be code. In certain embodiments, since code and data are separated from each other in different memory blocks, constants used by the code may be required to be located in the data section rather than the code section.

In step 310, a set of memory access requests is accepted. Such memory access requests may include, for example, read or write requests.

In step 320, it is determined which memory blocks are to service the requests. In an embodiment described above, a controller or combination of controllers determines from the configuration information and the requests which memory blocks are to service the requests. In alternate embodiments, other methods may be used.

In step 330, the memory blocks service the requests.

In step 340, if any data is to be returned, the relevant memory blocks return the data. In an embodiment described above, the data is placed on a set of data lines.

In an alternate, each memory block may be accessed from any input/output port on each clock cycle. Each memory block may only allow one memory access on each clock cycle, so arbitration is used serving one port for the clock cycle, and serving other requesting ports on later clock cycles. Such an embodiment may allow for each memory block to be read/write, or either read only or read/write.

Figure 3:
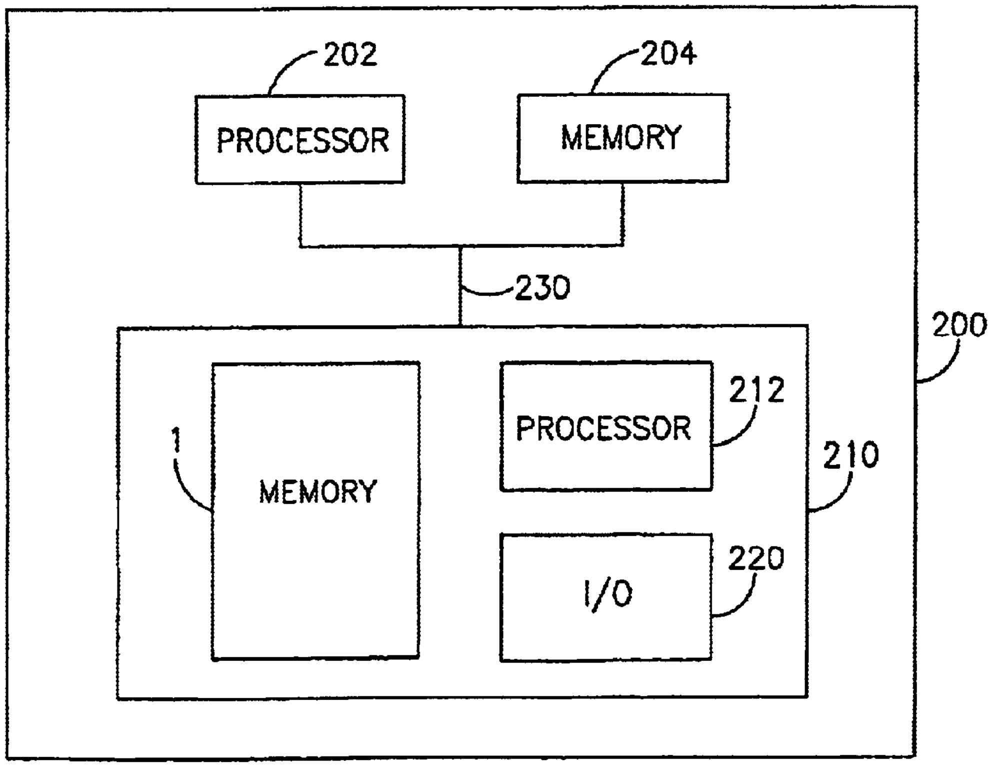
FIG. 3 is a block diagram depicting a data processing device including a memory according to an embodiment of the present invention.

Various applications may be used with a memory according to embodiments of the present invention, and a memory according to embodiments of the present invention may be constructed in different manners. In one embodiment, the memory unit 1 is placed on one chip, the chip including other components such as a processor. Such a chip may be included in, for example, a circuit board, a card, a personal computer (PC), or a device controller, such as a controller used in an automobile or consumer appliance. FIG. 3 is a block diagram depicting a data processing device including a memory according to an embodiment of the present invention. Such a data processing device 200 (such as a PC or a specialized card or subsystem in a computer or appliance) may include a processor 202, a memory 204 (e.g., RAM, SRAM, DRAM), and a "computer on a chip" 210 which in turn, includes a memory 1 according to an embodiment of the present invention, a processor 212 (such as a microprocessor), and I/O circuitry 220. The components may be connected by a data bus 230, which may be a series of data busses. Other known components (not shown) may be included, such as a power supply, or an input output controller.

Because the controller or controllers of a memory according to embodiments of the present invention access preferably conventional memory cells, the additional cost associated with dual port memory cells is avoided. Furthermore, the size of the memory may be reduced compared with conventional dual port memories. Because, in certain embodiments, the partitioning of the memory may be varied and selected, the memory is more flexible. For example, in certain embodiments, the memory can provide a variable size code segment and a variable size data segment, depending on the application with which the memory is used. In addition, preferably, the addressing for each segment is contiguous, providing several separate "virtual" memories.

While certain features of the invention have been illustrated and described herein, many modifications, substitutions, changes, and equivalents will now occur to those of ordinary skill in the art. For example, the partitions are not restricted to holding code and data, there may be more than two partitions, and the numbers of memory banks may be other than three. It is, therefore, to be understood that the appended claims are intended to cover all such modifications and changes as fall within the true spirit of the invention.

What is claimed is:

1. A memory comprising:

a set of memory banks;

a set of controllers, each controller associated with a memory bank and providing access to the associated memory bank, each of the controllers including circuitry to determine whether or not an associated memory bank is active within a clock cycle; and a register storing partition information;

wherein the set of memory banks is selectively partitionable into a first partition and a second partition; and wherein during each clock cycle at least one memory bank from each set may exchange data with its associated controller.

2. The memory of claim 1 comprising DRAM memory cells.

3. The memory of claim 1 comprising SRAM memory cells.

4. A method of accessing a memory, the memory comprising a plurality of memory banks, each memory bank including at least a controller to determine whether or not an associated memory bank is active within a clock cycle, the method comprising partitioning the memory banks according to a configuration register and on each clock cycle, accessing a plurality of memory banks and exchanging data between the plurality of memory banks and a set of external data lines.

5. The method of claim 4, comprising accepting signals from a first set of address and control lines and from a second set of address and control lines, wherein during each clock cycle the signals are sent to a subset of the memory banks.

6. The method of claim 4 wherein the plurality of memory banks are divided into partitions, wherein on each clock cycle at least one memory bank per partition may be accessed.

7. The memory of claim 4, wherein the memory banks are partitioned into a code partition and a data partition.

8. The method of claim 4 comprising accepting signals from a first set of address and control lines and from a second set of address and control lines, wherein during each clock cycle the signals are sent to a subset of the memory banks.

9. The method of claim 4 wherein the plurality of memory banks are divided into partitions, wherein on each clock cycle at least one memory bank per partition may be accessed.

* * * * *